United States Patent [19]

Kimura et al.

[11] Patent Number: 4,722,130

[45] Date of Patent: Feb. 2, 1988

[54] METHOD OF MANUFACTURING A SEMICONDUCTOR DEVICE

[75] Inventors: Takashi Kimura, Yokohama; Toshihiro Kato, Chigasaki, both of Japan

[73] Assignee: Kabushiki Kaisha Toshiba, Kawasaki, Japan

[21] Appl. No.: 15,585

[22] Filed: Feb. 17, 1987

Related U.S. Application Data

[63] Continuation of Ser. No. 795,655, Nov. 6, 1985, abandoned.

[30] Foreign Application Priority Data

Nov. 7, 1984 [JP] Japan ............... 59-233330

[51] Int. Cl.$^4$ ............................................. B23P 17/00
[52] U.S. Cl. ............................ 29/413; 29/423; 29/846; 51/283 R; 437/226
[58] Field of Search ................... 156/153–155, 156/247, 257; 51/281 R, 283 R; 29/423, 846, 825, 834, 835, 413; 225/2, 96.5

[56] References Cited

U.S. PATENT DOCUMENTS

| | | | |
|---|---|---|---|
| 3,040,489 | 6/1962 | Costa | 29/413 |
| 3,488,835 | 1/1970 | Becke et al. | 29/590 |
| 3,633,269 | 1/1972 | Bachmeier | 156/247 |
| 3,636,618 | 1/1972 | Herzog et al. | 29/589 |
| 3,727,282 | 4/1973 | Nearg | 29/413 |
| 4,321,747 | 3/1982 | Takemura et al. | 29/423 |
| 4,445,956 | 5/1984 | Freeman et al. | 29/423 |
| 4,451,972 | 6/1984 | Batinovich | 29/590 |
| 4,519,168 | 5/1985 | Cesna | 51/283 R |

OTHER PUBLICATIONS

Japanese Patent Disclosure (KOKAI) No. 57-145339, Sep. 8, 1982.

Primary Examiner—Frederick R. Schmidt
Assistant Examiner—Robert Showalter
Attorney, Agent, or Firm—Finnegan, Henderson, Farabow, Garrett & Dunner

[57] ABSTRACT

Disclosed is a method of manufacturing a semiconductor device which comprises the step of forming grooves in the form of a grid on the upper surface of a semiconductor wafer formed with elements, the step of grinding or polishing the underside of the semiconductor wafer to thereby reduce the thickness thereof, the step of applying a first single-sided, self-adhesive sheet onto the underside of the semiconductor wafer, and the step of stretching the second single-sided, self-adhesive sheet so as to space out each other a multiplicity of semiconductor chips divided along the gridlike grooves of the semiconductor wafer. Each semiconductor chip is picked up and mounted on a lead frame.

4 Claims, 5 Drawing Figures

F I G. 1A 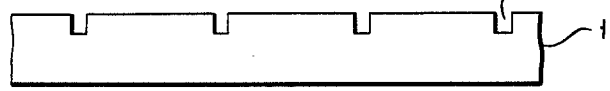
F I G. 1B 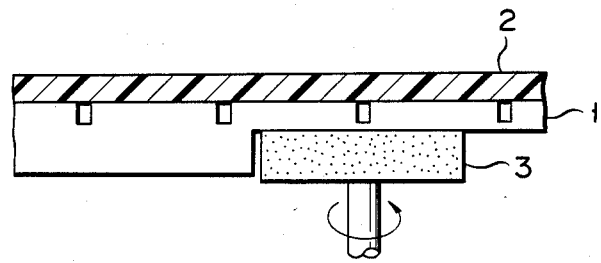
F I G. 1C 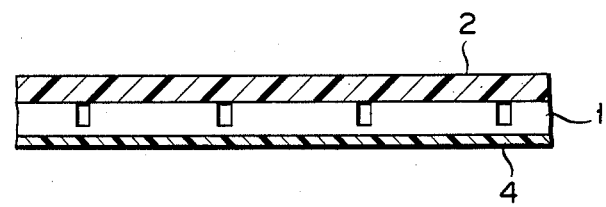
F I G. 1D 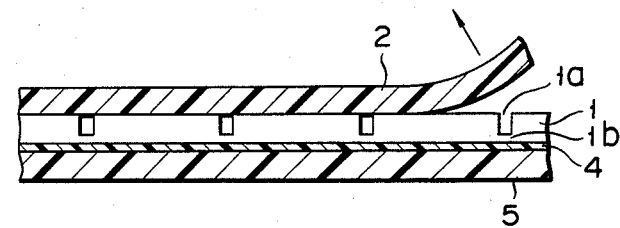
F I G. 1E 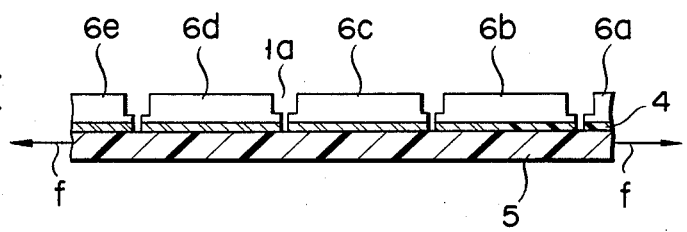

METHOD OF MANUFACTURING A SEMICONDUCTOR DEVICE

This application is a continuation of application Ser. No. 795,655, filed Nov. 6, 1985, now abandoned.

BACKGROUND OF THE INVENTION

I. Field of the Invention

The present invention relates to a method of manufacturing a semiconductor device and, more particularly, to a method of manufacturing a semiconductor device, in which a semiconductor wafer is protected from damage in the process of dicing the wafer into diebonding chips.

II. Description of the Prior Art

The manufacturing process of a semiconductor device consists essentially of a process of forming elements (called "wafer process"), in which elements are formed on a semiconductor wafer, and an assembling process in which the semiconductor wafer with such elements is divided into a plurality of chips, each of which will be mounted on a frame or case.

Conventionally, before the semiconductor wafer with elements is divided into individual chips, the underside of the wafer is uniformly partially removed by, for example, lapping, and the wafer is thereby reduced in thickness. Subsequently, in order to improve the mounting capacity of the chips, a metal thin film is formed by vapor deposition on the underside of the wafer. Thereafter, gridlike grooves are formed in the element formation surface of the wafer with a hard tool such as a scribing probe, diamond wheel, or diamond blade. Thereafter, the wafer is divided into chips. Each chip thus obtained is bonded to a lead frame by using an insulating paste or Ag-containing conductive paste.

In the above-described assembling process, the wafer polished and made thinner is often cracked or broken at the portions other than those corresponding to predetermined dicing lines, in various succeeding steps including the metal vapor deposition step. This hinders the mass-production of the chips. This problem is particularly prominent in the case of a GaAs wafer which is mechanically weaker than a silicon wafer.

Further, in recent years, it has been proposed that a semiconductor wafer of larger diameter be used to increase the degree of integration and the chip yield. On the other hand, as the packing density of the semiconductor device increase, the use of a semiconductor wafer having a thickness smaller than in the prior art and having a greater dissipation property is proposed. When the wafer has a greater diameter and a small thickness it will more likely be cracked or broken even if it is made of silicon having a relatively high mechanical strength. The yield of the chip will then be very low. Besides, when a chip thinner than the prior art chip is mounted on a lead frame and secured to it with a paste, the paste may creep up onto the chip surface due to a smaller thickness of the chip, so that the elements provided on the chip are shortcircuited or contaminated by the paste. Accordingly, where the conventional method of mounting the chip is applied to a thin chip, there is the possibility that the reliability as well as the manufacturing yield of the semiconductor device is greatly decreased.

SUMMARY OF THE INVENTION

In view of the above, the object of the invention is to provide a method of manufacturing a semiconductor device which is capable of preventing the undesired crack and breakage of a semiconductor wafer after the underside thereof is ground or polished, thereby enabling the semiconductor device of high reliability to be manufactured with high yield.

According to the present invention, there is provided a method of manufacturing a semiconductor device comprising the step of forming grooves in the form of a grid on the upper surface of a semiconductor wafer formed with elements; the step of grinding or polishing the underside of the semiconductor wafer to thereby reduce the thickness thereof; the step of applying a single-sided self-adhesive sheet onto the underside of the semiconductor wafer; and the step of stretching the single-sided self-adhesive sheet so as to space out from each other a multiplicity of semiconductor chips divided along the gridlike grooves of the semiconductor wafer.

The formation of the gridlike grooves in the surface of the semiconductor wafer can be made with the use of a diamond wheel, diamond blade or scribing probe. The depth of the grooves, preferably, is to such an extent as to permit the wafer to be prevented from being separated into individual chips even when the underside thereof is ground or polished, and yet as to permit the chips to be easily separated from each other by application of a specified force after the underside of the wafer is ground or polished. Although the depth of the gridlike grooves may be one which permits the wafer to be separated into individual chips by grinding or polishing the underside, in this case it is necessary to apply a first single-sided self-adhesive sheet on the upper surface of the wafer before grinding or polishing the underside of the same. Further, the depth of the gridlike grooves may be also one which is equal to the whole thickness of the wafer, that is, the grooves may take the form of slits piercing therethrough. In this case, however, a single-sided self-adhesive sheet is required to be applied onto the underside of the wafer prior to forming the grooves and, after forming same, another single-sided self-adhesive sheet is pasted onto the upper surface of the wafer and, thereafter, the former sheet is exfoliated from the underside of the wafer.

A single-sided self-adhesive sheet which has been prepared by coating adhesive agent onto one side surface of a synthetic resin sheet consisting of polyvinyl chloride, polyethylene, nylon, etc. can be used as one for the present invention.

The grinding of the wafer underside can be effected with the use of, for example, a diamond wheel. The lapping may be also effected by using grinding sand of, for example, SiC or $Al_2O_3$.

Where the invention is applied to the manufacture of a high frequency semiconductor device, it is necessary to form a metal thin film of, for example, V, Ni or Au on the underside of the wafer by evaporation or sputtering. Preferably, the formation of this metal thin film is performed in a state wherein the wafer is intensified by a first single-sided self-adhesive sheet pasted on the upper surface of the wafer. It is to be noted here that the grinding of the wafer underside also is preferably performed in a state wherein the wafer is intensified by a first single-sided self-adhesive sheet.

It is possible to form a bonding layer for die-bonding, on the ground or polished surface of the wafer or on the underside of the metal thin film. The bonding layer may be one which has insulating property, or one which has conductive property. Where the bonding layer is one which has conductive property, it is suitable for manufacture of a semiconductor device of the type wherein electrodes are formed on the underside of the chip.

Where the first self-adhesive sheet is applied to the upper surface of the wafer, this sheet is exfoliated after a second self-adhesive sheet has been applied to the underside of the wafer. By the force produced from exfoliation, or a separate force applied to the wafer, cracks are produced in the wafer along the gridlike grooves, whereby the wafer can be separated into individual chips.

Thereafter, the space between the chips is enlarged by a stretching of the second self-adhesive sheet in the horizontal direction, whereby easy diebonding becomes possible.

According to the above-described method of the invention, the gridlike grooves are formed before the wafer thickness is reduced. For this reason, the wafer is prevented from being cracked in portions other than those corresponding to the grooves at the time of grinding or polishing the wafer underside, or carrying out various succeeding steps. Particularly when a first self-adhesive sheet is applied to the upper surface of the wafer, this wafer is thereby reinforced, so that the production of cracks in the wafer is prevented.

Further, according to the method of the invention, a semi-hardened bonding layer may be formed, with high controllability, on the underside of the wafer. As a result, it has become impossible that the bonding agent creeps up onto the chip surface at the time of die-bonding the chip.

According to the method of the present invention, therefore, it is possible to manufacture a semiconductor device of high reliability with high yield from a silicon semiconductor wafer having a very large diameter and a small thickness or fragile GaAs semiconductor wafer. Thus, the method of the present invention contributes to the industry as a technique of mass-producing semiconductor devices which uses such semiconductor wafers.

BRIEF DESCRIPTION OF THE DRAWINGS

FIGS. 1A to 1E are sectional views showing the steps which constitute a scribing process of a semiconductor wafer in accordance with an embodiment of the present invention.

DETAILED DESCRIPTION OF THE PREFERRED EMBODIMENT

A method of manufacturing a semiconductor device in accordance with an embodiment of the present invention will now be described with reference to FIGS. 1A to 1E.

First of all, as shown in FIG. 1A, grooves 1a having a depth of 140 μm, which are shaped like a grid and the space interval between which is 400 μm, were formed by known method vertically and horizontally on the element formation surface of GaAs wafer 1 having a diameter of 76 mm and a thickness of 630 μm. Next, as shown in FIG. 1B, a single-sided self-adhesive nylon sheet (first single-sided self-adhesive sheet) 2 was applied to the element formation surface (the surface formed with the grooves) of the wafer 1. Subsequently, the underside of the wafer 1, i.e., the opposite surface to that on which the self-adhesive sheet 2 is applied, was polished by a diamond wheel 3 over the entire surface to thereby reduce the thickness of the wafer 1 to 160 μm (FIG. 2B). Thereafter, a Au film not shown (having a thickness of μm), which is necessary for a high frequency element, was formed by evaporation on the polished surface of the wafer 1.

Next, an epoxy-resin paste containing Ag was coated by screen printing on the whole underside of the wafer 1. Thereafter, the resultant wafer 1 was baked at a temperature of 80° C. for about one hour. Thus, as shown in FIG. 1C, a bonding layer 4 for B-stage diebonding was formed with a thickness of approximately 15 μm. Thereafter, as shown in FIG. 1D, a single-sided self-adhesive sheet (second self-adhesive sheet) 5 of polyvinyl chroride film having a acrylic bonding agent layer was applied to the underside of the bonding layer 4. Subsequently, the self-adhesive sheet 2 on the upper surface of the wafer 1 was exfoliated. In this case, the self-adhesive sheet 2 is sequentially exfoliated from one side thereof. By so doing, an upward bending moment acts on the wafer 1 to cause a crack 1b to be produced in the bottom portion of the groove 1a. As a result, each chip which has theretofore been divided from an adjacent chip only at the surface but connected thereto at the bottom portion of the groove 1a is completely separated from the adjacent chip.

After the self-adhesive sheet 2 is peeled off, the self-adhesive sheet 5 is heated and is stretched in a direction indicated by an arrow f as shown in FIG. 1E. Then, the groove 1a between adjacent two of the chips 6a, 6b, 6c, 6d and 6e is widened, so that, in the next diebonding step, the chip can easily be picked up.

The biebonding of each chip onto a lead frame is effected by picking up each chip 6a to 6e from the self-adhesive sheet 5 and mounting it onto the lead frame. In the above-mentioned embodiment, however, the semi-hardened bonding layer 4 is formed on the underside of the chip. Therefore, the diebonding is possible soon after the chip involved is mounted on the lead frame. In addition, the thickness of the bonding layer 4 is strictly controlled beforehand. Therefore, it is impossible that at the time of diebonding the bonding agent creeps up onto the surface of the chip.

We claim:

1. A method of manufacturing a semiconductor device comprising forming grooves in the form of a grid in an upper surface of a semiconductor wafer formed with elements, applying a first single-sided self-adhesive sheet onto the upper surface of said semiconductor wafer formed with said grooves to reinforce said wafer, after forming said grooves and applying said first sheet grinding or polishing an underside of said semiconductor wafer to reduce the thickness thereof, applying a second single-sided selfadhesive sheet onto the underside of said semiconductor wafer and stretching said second single-sided self-adhesive sheet to space out from each other a multiplicity of semiconductor chips divided along the grooves of said semiconductor wafer.

2. A method of manufacturing a semiconductor device according to claim 1, which further comprises
   forming a semi-hardened resin bonding layer, intended for use in diebonding, on said ground or polished underside of said semiconductor wafer.

3. A method of manufacturing a semiconductor device according to claim 2, which further comprises forming a metal thin film between the ground or polished underside of said semiconductor wafer and said bonding layer.

4. A method of manufacturing a semiconductor device according to claim 1, which further comprises peeling off said first self-adhesive sheet after said second self-adhesive sheet has been applied.

* * * * *